United States Patent
Andeen et al.

(10) Patent No.: US 6,204,673 B1
(45) Date of Patent: Mar. 20, 2001

(54) METHOD AND APPARATUS USING FEEDBACK TO CORRECT THE PRODUCTION OF MAGNITUDE AND PHASE RELATIONSHIPS BETWEEN TWO SINUSOIDAL SIGNALS FOR USE IN A RATIO-TRANSFORMER CAPACITANCE BRIDGE

(75) Inventors: Carl G. Andeen, Euclid; Carl W. Hagerling, Chagrin Falls; Stephen E. Flocke, Lyndhurst, all of OH (US)

(73) Assignee: Andeen-Hagerling, Inc., Solon, OH (US)

( * ) Notice: Subject to any disclaimer, the term of this patent is extended or adjusted under 35 U.S.C. 154(b) by 0 days.

(21) Appl. No.: 09/207,756

(22) Filed: Dec. 1, 1998

(51) Int. Cl.[7] .............................. G01R 17/10; G01R 27/28
(52) U.S. Cl. ............................................. 324/725; 324/651
(58) Field of Search ..................................... 324/725, 651, 324/659, 679, 680; 375/226, 261, 269, 294

(56) References Cited

U.S. PATENT DOCUMENTS

| | | |
|---|---|---|
| 3,473,117 | 10/1969 | Ito . |
| 3,562,641 | 2/1971 | Fulks . |
| 4,772,844 | 9/1988 | Andeen et al. . |
| 4,841,228 * | 6/1989 | Noguchi et al. ..................... 324/659 |
| 4,896,100 * | 1/1990 | Buck ..................................... 324/679 |
| 5,113,140 * | 5/1992 | So ......................................... 324/680 |

OTHER PUBLICATIONS

Cutkosky, Robert D., IEEE Transactions on Instrumentation and Measurement, vol. IM–34, No. 3, Sep. 1985, Title: An Automatic High–Precision Audiofrequency Capacitance Bridge "No Month Available".

Manual for Capacitance Bridge Circuit AH 2500A, Chapter 10, Circuit Descriptions, pp. 10–1 10–16 and drawings and parts lists, pp. 10–15 and 10–16 and F–3 and F–5, "No Month Available".

* cited by examiner

*Primary Examiner*—Safet Metjahic
*Assistant Examiner*—J. Kerveros
(74) *Attorney, Agent, or Firm*—Renner, Otto, Boisselle & Sklar, LLP (57) ABSTRACT

A capacitance measuring device and method including ratio transformers, a reference capacitor(s), multiplying digital-to-analog converters connected to form a bridge, the converters being adjustable to at least partially balance the bridge, digital signal processor (DSP) for driving and control functions, and feedback to the DSP to maintain and to correct in real time desired amplitudes and phase relation of the signals produced by the ratio transformers. Commutation is used to balance or to average feedback signals to enhance precision, accuracy, resolution and stability. The bridge uses DSP generated phase shifted signals and reference capacitors to balance the real part of the unknown impedance.

27 Claims, 6 Drawing Sheets

FIG. 6

# METHOD AND APPARATUS USING FEEDBACK TO CORRECT THE PRODUCTION OF MAGNITUDE AND PHASE RELATIONSHIPS BETWEEN TWO SINUSOIDAL SIGNALS FOR USE IN A RATIO-TRANSFORMER CAPACITANCE BRIDGE

TECHNICAL FIELD

The invention relates to impedance measuring, and, more particularly, to method and apparatus for measuring impedance using a bridge circuit with digital signal processing and, even more particularly, to method and apparatus for obtaining accurate relationships between signals used in ratio transformer capacitance bridge circuits.

CROSS REFERENCE TO RELATED PATENT

Reference is made to U.S. Pat. No. 4,772,844, the entire disclosure of which hereby is incorporated by reference.

BACKGROUND OF THE INVENTION

This invention relates to the measurement of electrical impedance, and in particular to the measurement of the loss and the very precise measurement of the capacitance of an unknown impedance where "loss" is used as a collective term to mean resistance, conductance, dissipation factor or any other term used to describe the real component of impedance. The technical literature is replete with numerous examples of impedance bridges of all kinds. These loss terms If are used equivalently and interchangeably below. Bridges have been in a state of continuous development and improvement for more than a century. Improvements have taken almost every conceivable form, in efforts to achieve higher accuracy, lower cost, better reliability, higher speed, wider range, etc. Some high performance bridges have been automated with the incorporation of microprocessors or related devices to allow these bridges not only to correct for various measurement errors, but to report their measurement results on sophisticated local displays or remotely via several different kinds of communication channels. Sufficient programming control is often provided to allow for sustained unattended operation.

In spite of the considerable attention given to impedance bridges in general, not all areas of bridge development have benefitted from new ideas, particularly in the application of microprocessors and digital signal processors (sometimes referred to below as DSP). Ratio transformer bridges have been used for high precision measurements of capacitance and loss. Several examples of ratio transformer bridges include those disclosed in U.S. Pat. No. 4,772,844. U.S. Pat. No. 4,772,844 describes a method for producing very accurate magnitude and phase relationships between two sinusoidal signals generated by two ratio transformers. Such signals are useful in a particular kind of ratio-transformer capacitance bridge where instead of balancing the resistive component of the unknown impedance against a reference resistor, it is instead, balanced against a reference capacitor driven by a 90° phase-shifted signal.

SUMMARY OF THE INVENTION

A new method described herein is an improvement to the method described in U.S. Pat. No. 4,772,844. The new method has the major advantages over the old of being inexpensive and reliable to implement over a wide range of frequencies. It has a further major advantage over the old since it can continuously correct the relationships between two sinusoidal signals in real time.

An aspect of the invention is to produce from independent ratio transformers two sinusoidal signals whose magnitudes and relative phase are accurately related. It is a straightforward problem to program a digital signal processor (sometimes referred to below as a DSP) to produce very accurate sinusoidal waveforms as a function of time and to use these waveforms to drive digital-to-analog converters (sometimes referred to below as D/A or in the plural as D/A's) which will produce signals that can drive one or more ratio transformers. The difficulty with this is that the conversion and driving circuits will introduce gain and phase errors so that the analog signals coming out of the ratio transformers deviate unacceptably from the digital signals produced within the DSP. What is worse is that these errors will change over time as a result of changes in temperature, changes in components, and changes in the loading of the ratio transformers. It is an aspect of the invention to correct these errors in real time.

The new method uses a DSP fast enough to handle the desired frequencies. It also uses analog-to-digital converters (sometimes are referred to below as A/D or in the plural as A/D's) and D/A's with adequate resolution and employs a technique to increase precision.

In U.S. Pat. No. 4,772,844 it is an object to measure impedance, and particularly capacitance, to extremely high precision at an improved speed and ease of use. It is an aspect of the present invention to measure such impedance at multiple frequencies. It also is desirable to measure such impedance using DSP technology for signal generation, control purposes, and the like.

In U.S. Pat. No. 4,772,844 is disclosed a ratio transformer capacitance bridge useful at herein, including solid state ratio transformer driven, multiplying digital to analog converters (hereinafter referred to as SSRTMDACs) which can help measure capacitance and loss rapidly, with low cost and good reliability.

Various objectives of U.S. Pat. No. 4,772,844 also are applicable to respective features of the present invention.

It would be desirable to be able to measure loss at more than one frequency and, especially, to measure loss at multiple frequencies (sometimes referred to below as multi-frequencies), for example at discrete frequencies and/or over a continuous frequency range, e.g., over a continuous range or spectrum of frequencies. It would be desirable to measure loss using techniques of U.S. Pat. No. 4,772,844, for example. It also would be desirable to make such measurements using signals in a ratio transformer type bridge circuit wherein the relationship, such as the amplitude and phase relation, between plural respective signals output by the ratio transformers can be accurately controlled and/or corrected to maintain a desired relationship. In an exemplary embodiment described in detail below, two ratio transformers are used, and the relationship between the output signals produced thereby is equal amplitude and 90° phase shift; however, it will be appreciated that the objectives and features of the invention include maintaining different relationships between such signals.

Another aspect of the invention relates to the use of DSP technology to develop signals such as sinusoidal signals for driving ratio transformers in a ratio transformer capacitance bridge circuit and, based on appropriate feedback, to control those sinusoidal signals to maintain a desired relationship between the outputs produced by the ratio transformers.

Another aspect of the invention relates to the use of commutation technique to average feedback signals representing outputs from respective ratio transformers enabling the use of relatively inexpensive and low resolution components, such as D/A's and A/D's in the driving and feedback circuits of the ratio transformer capacitance bridge while maintaining high precision, for example, including resolution, accuracy and stability. For example, precision may include resolution, accuracy and stability. One can put a specific number or value on resolution, accuracy; and stability; resolution, accuracy and stability may be components of the term or concept of precision.

Another aspect of the invention is to use conventional, relatively economical parts to generate accurately plural sinusoidal signals that have a desired amplitude and phase relationship, such as, for example, two sinusoidal signals that are of equal amplitude and 90° out of phase.

Another aspect of the invention is to generate plural signals having a desired amplitude and phase relationship, such as, for example, two signals that are of equal amplitude and out of phase by 90° or some other desired relationship, with high precision using DSP and A/D and D/A techniques.

Another aspect is to measure loss, such as, for example, dissipation factor, of an unknown capacitance with high precision, for example, with resolution at least to 0.01%, more preferably so the resolution is one part in 100,000, even more preferably so that accuracy is to one part in 30,000 and even more preferably so that stability is on the order of one part in 100,000 to one part in 300,000 of the loss.

Another aspect of the invention is to use DSP driving techniques to provide inputs to D/A to obtain respective sinusoidal waves to drive ratio transformers used in a ratio transformer capacitance bridge.

Another aspect relates to the use of A/D's to monitor the output signals from respective ratio transformers used in a ratio transformer capacitance bridge so that the outputs from the A/D's can be fed back to a DSP to correct driving signals produced by the DSP and, thereby, to maintain desired relationships and/or to correct relationships to those desired as to the output signals from respective ratio transformers.

Another aspect relates to the use of a DSP to generate digital sine wave functions converted in respective D/A's to provide respective sinusoidal waves/signals to drive respective ratio transformers of a multi-frequency capacitance measuring device.

Another aspect relates to overcoming the introducing of amplitude and phase shift errors in the output signals from respective ratio transformers used in a ratio transformer capacitance bridge, which desirably have a preferred amplitude and phase relationship, and also overcoming gain and phase shift errors in feedback circuitry which corrects signals driving the ratio transformers to maintain a desired relationship of such output signals.

Another aspect relates to the correcting of amplitude and phase shift errors in the relationship between a pair of sinusoidal or other varying signals in real time while using such signals in a ratio transformer multi-frequency capacitance measuring device to measure capacitance.

Still another aspect relates to correcting amplitude and/or phase relationships between plural signals, such as sinusoidal signals, used to drive ratio transformers in a ratio transformer bridge operable at multiple frequencies or even over a continuous range of frequencies, to measure capacitance while using relatively imprecise electrical and/or electronic components to correct for deviations in the relationships of those signals.

Still another aspect relates to the use of a DSP to generate internally, digital representations of plural, for example, two, sinusoidal waves, for example, a sine wave and a cosine wave, in real time and correcting amplitude and/or phase relationships of such signals in real time so the outputs of respective ratio transformers used in a multiple frequency ratio transformer bridge type capacitance measuring device driven by those sinusoidal waves are maintained in the desired relationship.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. It will be appreciated that features of one or more embodiments hereof may be used with one or more other embodiments hereof.

Although the invention is shown and described with respect to certain preferred embodiments, it is obvious that equivalents and modifications will occur to others skilled in the art upon the reading and understanding of the specification. The present invention includes all such equivalents and modifications, and is limited only by the scope of the claims.

DESCRIPTION

Figure 1:
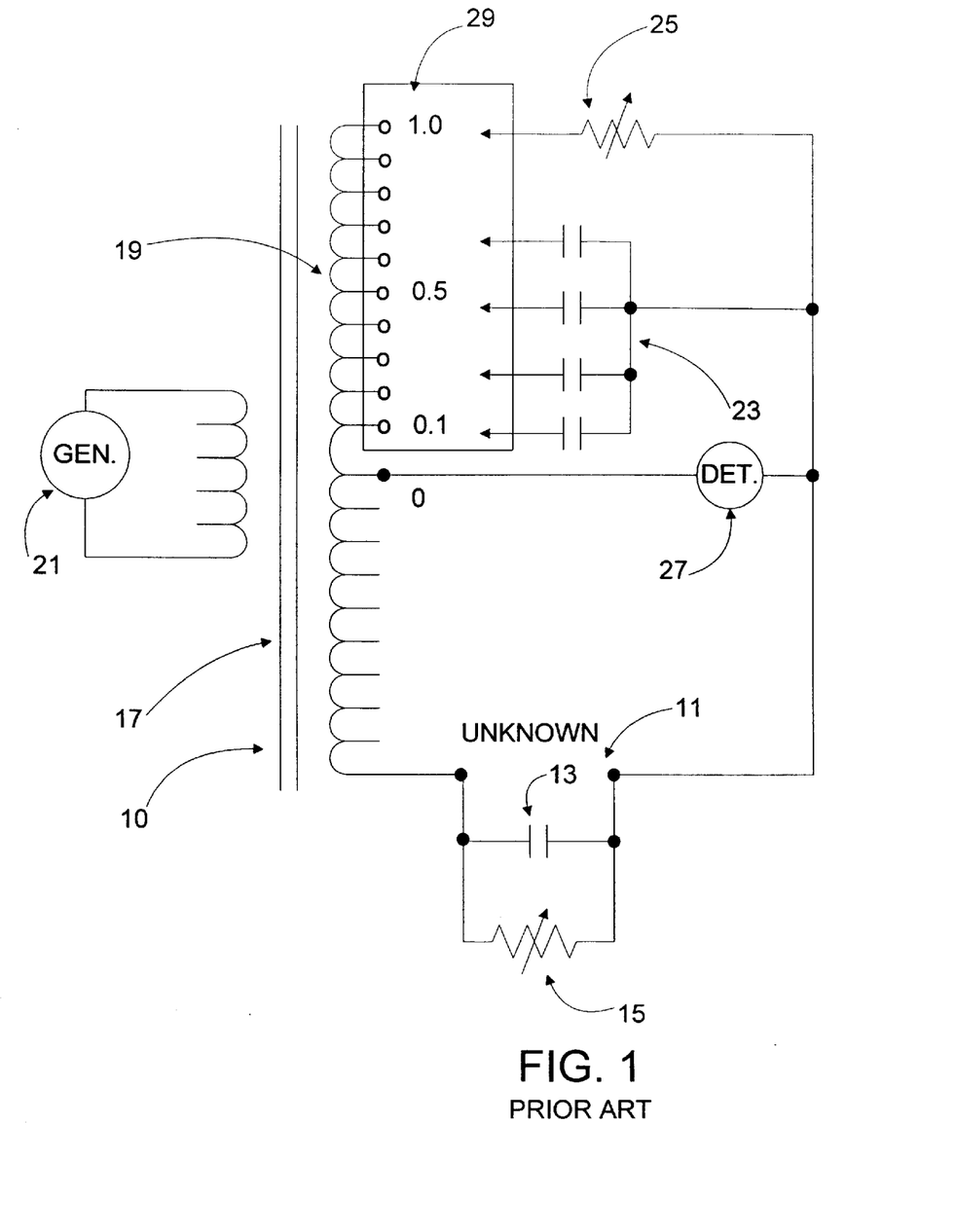
FIG. 1 is a schematic diagram of a ratio transformer bridge according to the prior art.

1. Method and Apparatus to Replace Relays with Solid State Components in a Ratio Transformer Bridge Referring to the drawings, wherein like reference numerals designate like parts in the several figures, FIG. 1 shows a prior art ratio transformer impedance bridge 10 designed to measure an unknown impedance 11 composed of a capacitance 13 and a loss 15. The bridge includes a voltage ratio transformer 17 which is constructed to provide very precise voltage ratios in proportion to the number of turns between its taps 19. This voltage ratio transformer (as opposed to a current ratio transformer) is also referred to herein as a "ratio transformer". The bridge is excited by a sinusoidal signal generator 21. The unknown impedance 11 is balanced against a set of known reference capacitors 23 and reference resistor(s) 25. A null voltage detector 27 is used to detect when the bridge is in a balanced state. An array of switches 29 is used to connect the appropriate standard capacitors 23 and standard resistors 25 to the appropriate taps 19 to achieve balance. The taps are shown in a decade configuration although any number base or combination thereof may be used. This bridge is an example of a capacitance bridge, such as the GenRad 1615A, where the switch array 29 is controlled manually. In the present invention, described below, a similar switch array is controlled by a microprocessor.

An automatic bridge built according to the schematic in FIG. 1 would be expensive to make if not completely impractical. One reason is the large number of standard capacitors 23 and resistors 25 along with their associated relays 29 which would be involved. Since the number of standard elements and, particularly, capacitors contained in a bridge will have a significant effect on the cost of the bridge, it is important to minimize the number of these capacitors that are used. The use of relays would make it slow and relatively failure prone.

Figure 2:
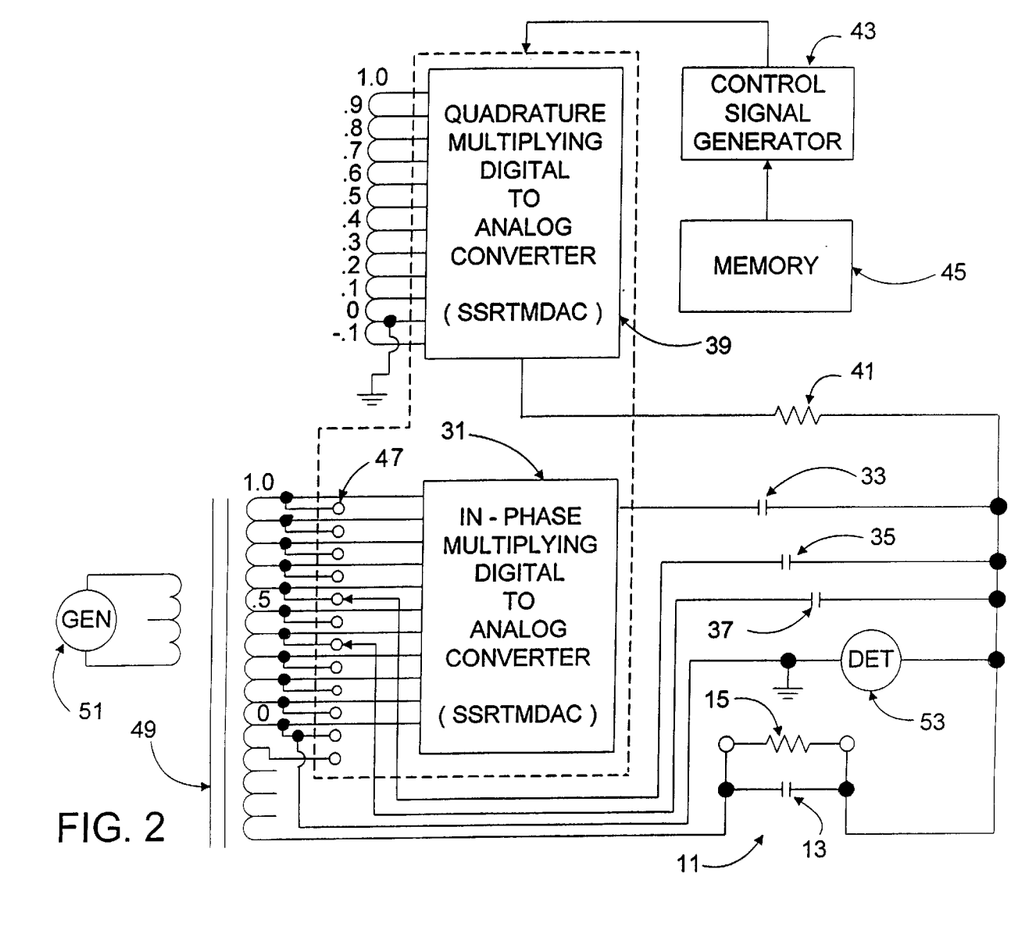
FIG. 2 is a schematic diagram of a ratio transformer bridge according to an embodiment of the invention.

FIG. 2 shows an embodiment of the present invention which is an improvement over the circuit of FIG. 1 where the many standard capacitors 23 of FIG. 1 have been replaced with only three such capacitors 33, 35, and 37. All but these three standard capacitors are replaced by a multiplying digital-to-analog converter (SSMDAC) 31 which drives a single standard capacitor 33. This converter will be referred to as the in-phase SSMDAC (or SSRTMDAC). The remaining two fixed standard capacitors 35, 37 balance the two most significant decades of the unknown capacitance 13 and must use relay switching elements as in FIG. 1 to give these two decades the greatest possible precision. The variable standard resistor(s) 25 are replaced with a second SSMDAC 39 which drives a single standard resistor 41. This SSMDAC will be referred to as the quadrature SSMDAC (or SSRTMDAC). This yields a total of four standard elements, three capacitors 33, 35, 37 and one resistor 41. This is a good choice for a bridge which is optimized to measure capacitance, but there is no reason why additional, more significant standard resistors could not be added, and even inductors are possible. Other components of the bridge of FIG. 2 include a control 43 and a memory 45 which are described below, a switch array 47 similar to array 29, a ratio transformer 49 like ratio transformer 17, a generator 51 like generator 21, and a detector 53 like detector 27 shown in FIG. 1.

Figure 3:
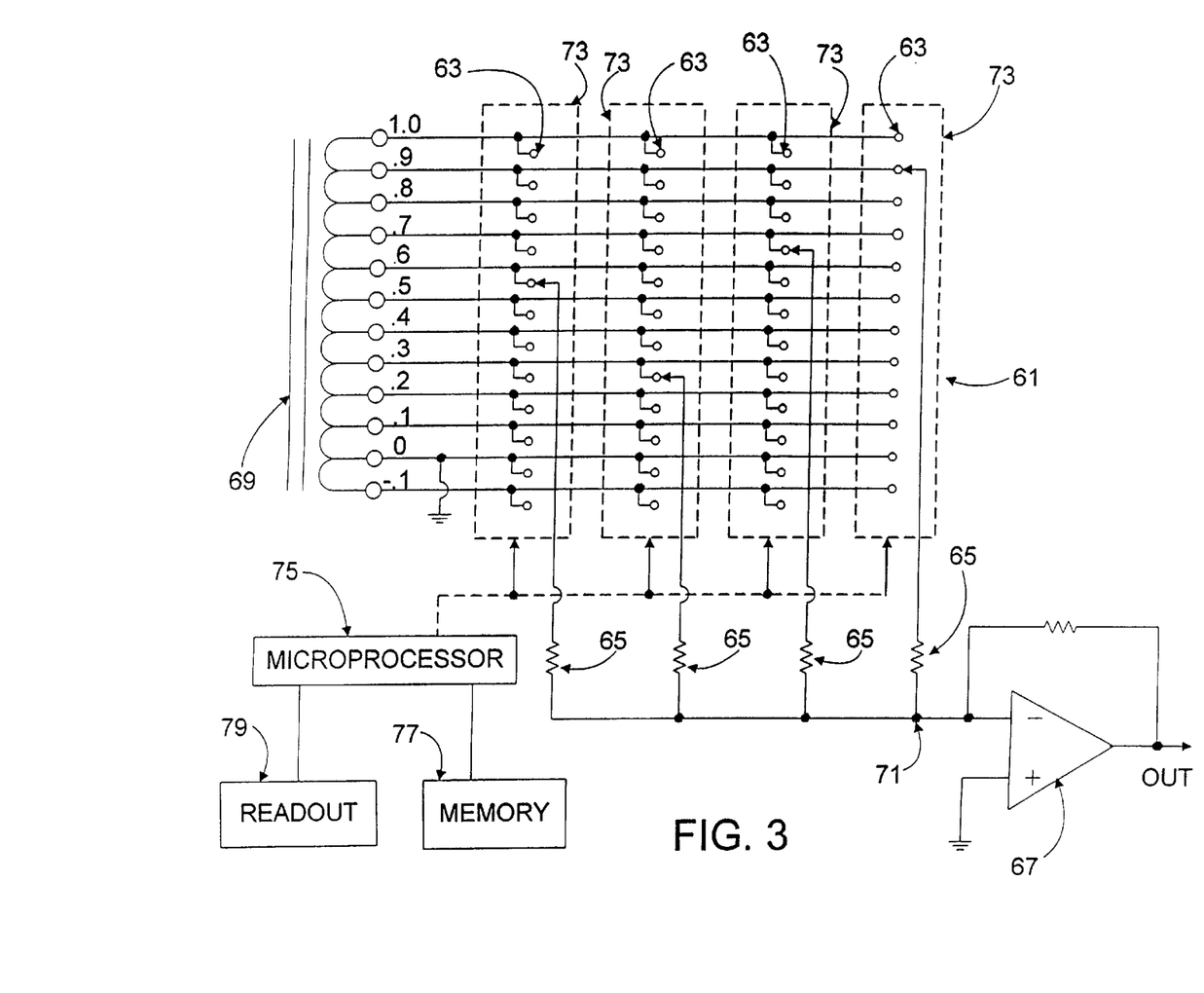
FIG. 3 shows schematically a SSRTMDAC as incorporated in the bridge of FIG. 2.

Construction of the SSMDAC's can take many forms, but a preferred unit is described herein and labeled "SSRTMDAC" and is shown in FIG. 3. The SSRTMDAC is identified by the reference numeral 61, and includes sets of switching elements 63 which are non-mechanical, preferably solid state switches, precision resistors 65 connected to switching elements 63 and an operational or summing amplifier 67. These components form a digital-to-analog converter having a ratio transformer 69 and a summing point 71. The precision resistors 65 and summing amplifier 67 form a summing circuit. Each of the precision resistors 65 has replaced one of the original standard capacitors 23. The resistors drive the summing point 71 of operational amplifier 67 much the way that the standard capacitors drove the summing point of the bridge in FIG. 1. The switching elements 63 are typically field effect transistors which are used for their speed, reliability and low cost. These switches may be incorporated into integrated circuit multiplexers 73 which also contain decoding and driving logic for the switches. The multiplexers select which tap of the ratio transformer 69 the resistors 65 are driven by. The multiplexers 73 are operated by a microprocessor 75 which controls the functions of the bridge. Microprocessor 75 operates in conjunction with a memory 77 and a readout 79 in a known manner. The net result is that the AC voltage at the output of the operational amplifier 67 can be set to any value with four decade resolution by the microprocessor. As with the bridge of FIG. 1, the SSRTMDAC example presented here is chosen so that each resistor 65 covers a single decade, but any number base or combination thereof may be used.

The advantage associated with using a ratio transformer as a part of a SSMDAC goes beyond that of providing more precise voltages for the summing amplifier 67 to select. The additional advantage lies in being able to precisely calibrate the entire SSRTMDAC. This will be discussed in detail later. Thus, the SSRTMDAC's eliminate the need for all but the largest standard capacitors by using precision resistors and other common circuit elements. This reduces the cost of the bridge and greatly increases its speed and reliability without sacrificing the precision of the instrument.

2. Method for Measuring the Loss Component of Impedance using a Standard Capacitor and a Phase Shifter as part of a Ratio Transformer Bridge FIGS. 1 and 2 have shown two different ratio transformer bridges which can be used to measure capacitance. In each case, the unknown capacitance is found by balancing it against a known standard capacitance. Similarly, a prior conventional practice was to identify an unknown loss by balancing it against a known resistance in some way. Both FIGS. 1 and 2 show a standard resistance 25, 41 which is used for this purpose.

Although the application of standard resistors to balance unknown resistances has withstood the test of roughly a century of use, there are three limitations to this basic technique. These limitations normally only become a problem when one is trying to build a capacitance bridge of the highest accuracy and resolution. The limitations are:

a. All resistors have a theoretical minimum noise voltage which appears across their terminals. This noise is commonly known as thermal or Johnson noise. Its magnitude is proportional to the resistance, the absolute temperature and the bandwidth. Due to its fundamental nature, it can not be eliminated by any degree of cleverness other than reducing the resistance, the temperature or the bandwidth to zero. Conventional practice normally is to keep these three parameters as low as is practical, but the only way to totally eliminate this noise source is to eliminate the resistance that causes it.

b. The impedance of any real resistor also has components of capacitance and inductance. Thus if a bridge were built using circuitry as simple as in the examples of FIGS. 1 and 2, it might have poor accuracy due to the extraneous capacitances that the resistors would introduce. A number of tricks can be pulled to reduce this problem to an acceptable level such as the use of a wye-delta transformation. This would use three smaller resistors to simulate one potentially very large one. Note, however, that the detector would now be shunted by a much smaller resistor which may increase the noise and decrease the sensitivity of the detector.

c. All resistors dissipate an amount of power equal to the square of the current through the resistor times the value of the resistor. This power causes the temperature of the resistor to increase which in turn causes its resistance to change by an amount which is proportional to its temperature coefficient. This can be a problem in resistors which are used as standards if it is not possible to make the current and/or the temperature coefficient small enough.

Clearly, if the loss component of the unknown impedance can somehow be balanced without actually using a resistor, then all of the above mentioned limitations inherent in the use of a resistor may be eliminated.

Figure 4:
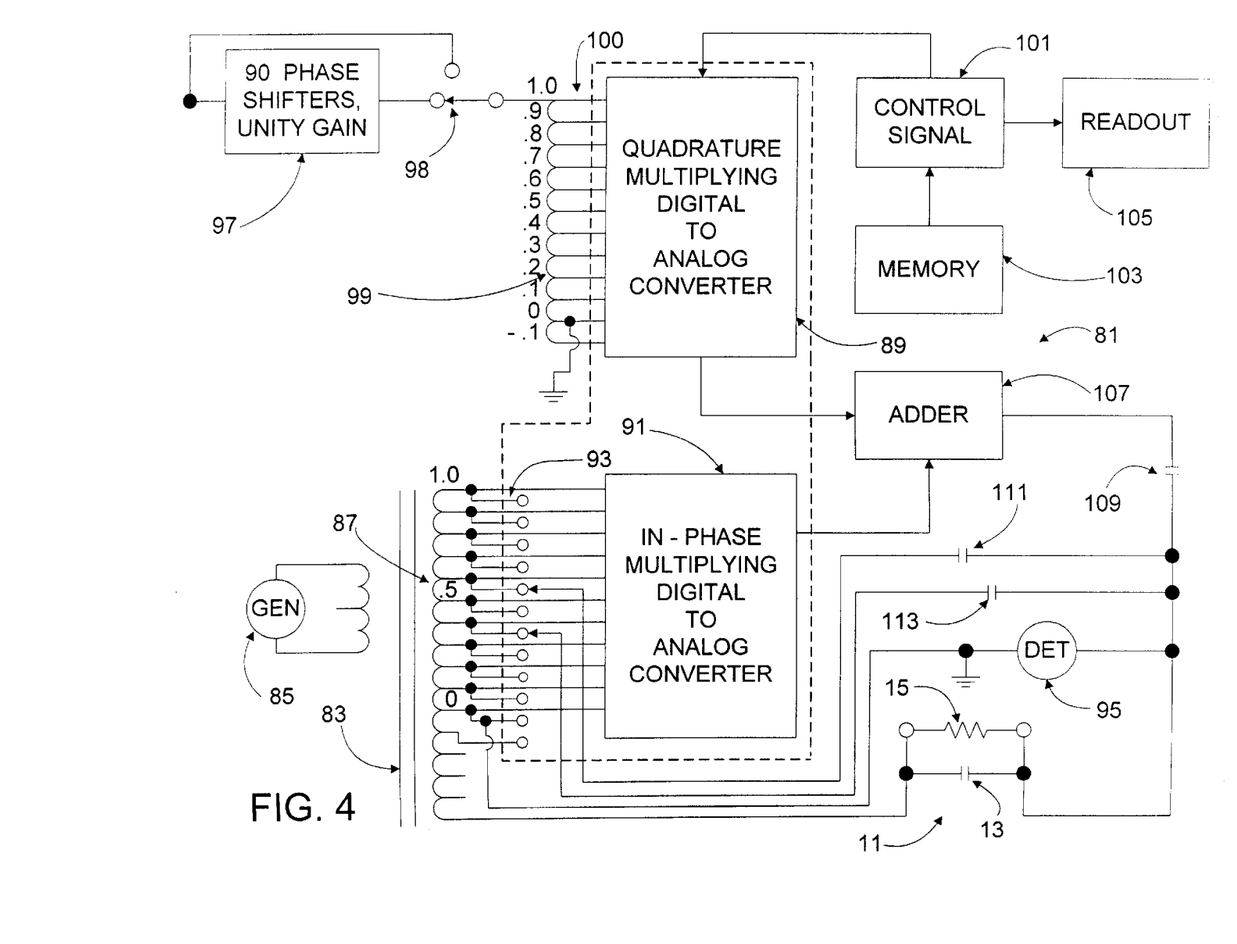
FIG. 4 is a schematic diagram of another embodiment of a ratio transformer bridge according to the invention, this bridge incorporating a phase shifter.

The present invention in a preferred form accomplishes this by replacing the standard resistor with a standard capacitor and a 90° phase shifter having unity gain. The basic schematic shown in FIG. 2 has been changed to reflect this new design in FIG. 4. Referring to FIG. 4, a ratio transformer bridge 81 is depicted which includes a ratio transformer 83, a generator 85, a set of taps 87, a quadrature SSRTMDAC 89, an in-phase SSRTMDAC 91, a set of relay switches 93, and a phase sensitive detector 95, all as discussed with regard to the circuitry of the preceding figures. A 90° phase shifter 97 with unity gain, is driven from a tap on the in-phase ratio transformer 87 and drives, through a switch 98, the quadrature ratio transformer 99 having taps 100 which are associated with SSRTMDAC 89. Both SSRTMDAC's are regulated by control signals 101 which operates under the influence of a memory 103 and which transmits output signals to a readout 105. The outputs of SSRTMDAC 89 and of SSRTMDAC 91 are connected to an adder 107. The output of adder 107 is connected to a reference capacitor 109. Reference capacitors 109 and 111 are adjustably connected to in-phase transformer taps 100 via relay switches 93.

In order to balance a given unknown resistance 15 by using a known capacitance, the known capacitor must have a capacitance equal to the reciprocal of the corresponding known resistor times the frequency, times $2\pi$ as is well known. With the capacitor chosen to be this value, the only difference between it and the known resistor is that the capacitor has shifted the phase by 90° and the resistor has not. Thus by adding a precise, unity gain, 90° phase shifter 97 of the opposite sign, the phase shift introduced by the standard capacitor 109 is canceled and the combination of the two circuit elements behaves like a resistor.

The benefits to this particular configuration are first that there are no standard resistors at the input of the detector 95 to create noise there; indeed, the only resistor-induced source of noise is that in the unknown 11 itself. Secondly, the absence of standard resistors in the bridge circuit itself means that the capacitance error across them is also eliminated. Although the resistors used in the SSRTMDAC 89 also have this kind of error, the problem is greatly reduced there since these resistors have a resistance which is small in comparison to their capacitive reactance. The latter is not true in the case of resistors which would be used directly in the bridge circuit because the resistance of these resistors must be very high in order to balance the large resistances that one expects from most unknown capacitors. If a wye-delta conversion implementation is used instead, then one is still limited by the stray capacitance in both resistors that form the top of the "T".

3. Method and Apparatus for Producing an Accurate 90° Phase Shift

Using the techniques discussed above, the accuracy with which the resistive component of the unknown impedance (loss) can be measured is limited largely by the quality of the 90° phase shift. Any error in the phase angle or the gain of the phase shifter will appear as an error in the capacitance and loss measurements.

There are many ways to shift the phase of a sinusoidal signal to accomplish the function of the phase shifter 97. Exemplary techniques are described in U.S. Pat. No. 4,772, 844, for example, with respect to the drawings of FIGS. 5 and 6 thereof. The present invention uses DSP and feedback to obtain desired relationships of amplitude and magnitude of two varying signals, for example, sinusoidal signals, and to obtain desired relationship of the phase of those signals, for example, to maintain a desired phase separation or phase difference. The amplitude relation described is equal amplitude, but, if desired, other relations may be obtained using features of the invention. The phase relation described is 90° phase relation (out of phase by 90°), but, if desired, other phase relations may be obtained using features of the invention. Driving and feedback control features of the invention are described below with regard to FIG. 5.

4. Replacement of Conventional High-accuracy Capacitance Standards with Inaccurate but Stable Capacitors The standard capacitors in all of the figures that we have referred to would, conventionally, have been constructed and adjusted to a high degree of accuracy to a specific predetermined value. For a decade bridge they usually would be related to each other by very precise factors of ten. The ultimate accuracy of the bridge would depend directly upon the accuracy of these standard capacitors.

There are several problems with trying to make extremely accurate capacitors (typically within the range of 0.1 to 10 ppm error). The adjustment of such capacitors to high accuracy is a difficult (and thus expensive) task with potentially imperfect results. Trimmer capacitors have been used in the past to make these adjustments, but the wider the range they cover, the more they are susceptible to stability problems themselves. A more modern standard might use metal films on a very stable substrate. Such films could be trimmed very precisely using lasers, but could not be changed in the field should the standard need recalibrating. Furthermore, neither trimmer capacitors nor laser trimming would allow zeroing the loss component of the standard's impedance. A truly high precision capacitance bridge must have either a standard with a near zero loss component or a means of compensating for a non-zero component. Our solution to these problems is to concentrate on constructing a very stable reference capacitor while only making its actual capacitance and loss values nominally correct. Such capacitors can work very well if the bridge is designed to correct for their inaccuracies.

To demonstrate the calculations required to perform such corrections we will use the example bridge circuit shown in FIG. 4 as an example. This circuit uses three reference capacitors 111, 109 and 109 whose values are related by roughly a factor of ten. The equation which describes the balanced bridge condition may be written as a sum of complex admittances in the form:

$$Y_x = T_1 Y_1 + T_2 Y_2 + T_3 Y_3 + jT_4 Y_3 \tag{1}$$

where Yx is the admittance of the unknown sample, $Y_1$, $Y_2$, and $Y_3$ are the admittances of the reference capacitors, $T_1$, $T_2$, $T_3$, and $T_4$ are the transformer turns ratios needed to achieve balance, and j is the square root of minus one. In this example, $T_1$ and $T_2$ are explicit taps on the ratio transformer each representing only a single decade of ratio. On the other hand, $T_3$ and $T_4$ each represent multiple decades of transformer taps synthesized by a SSRTMDAC. $T_3$ is the value for the in-phase SSRTMDAC and $T_4$ is the value for the quadrature SSRTMDAC. The j indicates that the signal phase is shifted by 90° for the quadrature SSRTMDAC.

Each of these complex admittances may be expanded as:

$$Y = [1/R] + j\omega C \tag{2}$$

where R is resistance, $\omega$ is $2\pi$ times the frequency, and C is capacitance ($C_1$ is the capacitance of capacitor 111, $C_2$ that of capacitor 109, and $C_3$ that of capacitor 109). If this expansion is substituted into equation 1, and the real and imaginary parts of the equation are separated, then the unknown resistance is:

$$R_x = 1/[(T_1/R_1)+(T_2/R_2)+(T_3/R_3)-T_4\omega C_3)] \quad (3)$$

and the unknown capacitance is:

$$C_x = T_1 C_1 + T_2 C_2 + T_3 C_3 + T_4/\omega R_3 \quad (4)$$

These two equations allow one to determine the value of the unknown capacitance and resistance to high precision if the transformer turns ratios and the admittances of the reference capacitors are also known to high precision. Similar results are easily obtained for other circuits having differing numbers of reference capacitors in the in-phase and/or quadrature sections of the circuit and even for circuits using different number bases.

Although, in this example, $C_1$ has been limited to being roughly ten times $C_2$ and $C_2$ must be roughly ten times $C_3$, there are several other restrictions that must be placed upon the values of the inaccurate but stable reference capacitors if they are to function properly in a precision bridge. Since the references are expected to be of good quality, all of the R's will be very large making the first three terms of equation 3 and the fourth term of equation 4 very small. This makes the determination of the unknown capacitance in equation 4 independent of frequency to the extent that the resistance, $R_3$, of reference $C_3$ is large. This is desirable in a bridge designed to measure capacitance to very high precision since it eliminates the need to know the frequency precisely.

The second restriction on the actual values that the reference capacitors may have, is needed to ensure that the range of unknown values that the bridge can measure does not contain gaps where the bridge cannot balance the unknown impedance. This can occur if the transformer voltage sections or increments are too large relative to the ratio of the values of adjacent capacitance reference decades. More specifically, given the worst case tolerances for the reference capacitors, the voltage contribution of the nth reference capacitor when driven by only a single (smallest) voltage section from the ratio transformer, must be less than or equal to the sum of the contributions of all the lesser reference capacitors when driven by the highest available transformer voltage. If the lesser reference values are written as C(n−1), C(n−−2), etc., then this may be expressed as:

$$FC(n)/N \leq fC(n-1)+fC(n-2)+fC(n-3)+ \quad (5)$$

where F is an error factor which represents the greatest amount by which the nth references can exceed its nominal value C(n). The error factor f, represents the greatest amount by which the values of the lesser references may fall short of their nominal values. The number of voltage increments (or sections) into which the output of the ratio transformer is divided is N.

If each decade (N-ade) of the bridge uses the same number base, then the various nominal reference values may be related by:

$$C(i) = BC(i-1) \quad (6)$$

where B is the number base, and C(i−1) is the next reference value of lesser significance below C(i). Combining equations 5 and 6 yields:

$$f/F \geq 1/(N/B+N/B^2+N/B^3+) \quad (7)$$

This puts a lower bound on the ratio of the allowable error factors. Although f and B have been assumed to be the same for each reference capacitor, this has been done to be able to arrive at the easily computable result of equation 7 and because most practical bridges would be designed this way. Otherwise, f and B need not be limited in this manner.

To look at some typical examples from equation 7, consider a decade bridge with a ratio transformer having ten taps so that N=9. This gives a lower bound for f/F of approximately 1.0 which means that the references can not deviate from their nominal value. This example applies to a conventional ratio transformer bridge having accurate standards.

If an eleventh tap is added to the previous example, then N=10 and the lower bound for f/F is approximately 9/10. This is equivalent to allowing the references to deviate from their nominal value by about 5%. (Actually, conventional ratio transformer bridges may have more than ten taps, but they have never been used in this manner to compensate for very inaccurate capacitance standards.)

The above discussion identified an important restriction on the actual values of the reference capacitors in the form of a lower bound for f/F. There is a remaining restriction on these values which may be thought of as providing an upper bound for f/F. However, rather than expressing this restriction in terms of an upper bound on f/F, it is much easier to express in terms of the maximum range and resolution that the bridge is to achieve. The range is limited by the actual value of the most significant reference capacitor which must be large enough to balance the largest unknown admittance that the bridge is required to measure. On the other hand, the resolution is limited by the least significant capacitor value which must be small enough to allow the bridge to measure to the desired level of resolution. Together, all the above restrictions determine how far the actual reference capacitor values can deviate from the desired nominal values while still allowing the bridge to meet all of its design goals.

If the restrictions on the actual values of the reference capacitors have been met, it is then a straightforward matter to measure these inaccurate references against an accurate standard and store these actual and now accurate values in a ROM. The microprocessor which operates the bridge then inserts these values into equations 3 and 4 (or their equivalent) to convert the stable but inaccurate numbers measured by the bridge to numbers which are truly accurate.

5. Method and Apparatus to Self-calibrate the Bridge Balancing Elements using the Ratio Transformers and a Single External Standard Capacitor as the Reference Standard Referring to the example bridge in FIG. 4, one sees that the transformer taps 87, 100 which are selectable by the SSRTMDAC's range in voltage from −0.1 to +1.0. This range goes beyond what is needed to balance an unknown impedance. For that, the taps need only cover the range from 0.0 to 0.9 or 1.0. The addition of the −0.1 and +1.0 taps allows the ratio transformers to be used to compare adjacent balancing decades of the bridge with one another. The largest reference capacitor 111, which balances the highest decade of capacitance can serve as a reference standard against which all of the smaller reference capacitors and decades of the SSRTMDAC's can be calibrated. It is the extremely high accuracy that can be obtained for the voltage ratios of the transformers that make this method of calibration so attractive. Ten to one ratios with an accuracy of one ppm are easily achieved.

To compare capacitor 111 against capacitor 109, capacitor 111 is connected to the −0.1 tap and capacitor 109 is connected to the 1.0 tap. The two SSRTMDAC's 89, 91 must be set to zero and no unknown impedance can be connected. Since $C_1$ is nominally 10 times $C_2$ and since precisely 10 times as much voltage of the opposite polarity is applied to $C_2$ as to $C_1$, the two voltage components measured at the phase sensitive detector 95 will be approximately zero. If this were done on a GenRad 1615A bridge, the calibration would be performed by adjusting the trimmer capacitor associated with the $C_2$ standard capacitor so as to get the minimum voltage at the detector. No provision is made to adjust for any loss in the 1615A bridge's standard capacitors. This manual adjustment of the capacitance error only, or small software compensations of less than 100 ppm represents the limit of the prior state of the art. Compensation for gross deviations of the reference capacitors from their nominal values on the order of several percent is new.

The value of the in-phase error voltage seen by the detector can be saved by the microprocessor as a measure of the capacitance error in capacitor 109 relative to capacitor 111. Likewise the value of the quadrature error voltage seen by the detector can be saved by the microprocessor as a measure of the loss error in capacitor 109 relative to capacitor 111. These error values can then be used by the microprocessor to arithmetically correct the readings of unknown impedance measurements. The immediate advantages over prior art are the elimination of trimmer capacitor hardware and the ability to correct the loss error as well as the capacitance error. No additional hardware is required over prior art implementations other than the use of an ADC as a part of the detector, but this ADC performs many other functions as well. A further capability which this method allows, becomes available when the error voltage exceeds the range of the ADC. In this case, the in-phase and/or quadrature SSRTMDAC's can be set to cancel the error voltage to a level such that the remainder falls within the range of the ADC. The in-phase correction value that the microprocessor stores is then a combination of the in-phase SSRTMDAC setting and the in-phase component of the ADC. The quadrature value is handled in the same manner. Thus the size of the error in the reference capacitor which can be corrected for is limited only by the considerations discussed in section 4.

So far, we have only described how this correction technique can be used to compensate for errors in the reference capacitors. The method need not stop with the reference capacitors; it can be extended downward, decade by decade through all the decades of the capacitance SSRTMDAC. The technique is precisely the same, but the errors being corrected for are now the flaws in most of the components in the SSRTMDAC and the adder. Some of these are the errors in the resistor values, the stray capacitance across the SSRTMDAC resistors and the series "on" resistance of the SSRTMDAC switching elements. As before, each of these errors has two components so that they may easily be thought of as vectors. This is a very powerful technique since it allows an inexpensive SSRTMDAC to operate at nearly the precision of a ratio transformer/relay configuration without the corresponding speed and reliability limitations.

We would like to be able to calibrate the loss SSRTMDAC in the same manner as the capacitance SSRTMDAC, but since the output of the loss SSRTMDAC is normally phase shifted 90°, a self-comparison cannot be made in the normal mode of operation. For this reason, FIG. 4 shows switch 98 which allows the loss SSRTMDAC 89 to be switched from its normal phase shifted mode of operation to a test mode which operates at the same phase as the in-phase SSRTMDAC 91. In fact, when the loss SSRTMDAC is in test mode, its behavior is indistinguishable from that of the in-phase SSRTMDAC and hence calibration values for it can be obtained in precisely the same manner as for the in-phase SSRTMDAC. This is very significant, because the ultimate calibration reference for both SSRTMDAC's is capacitor 111. Prior art, for example, would have employed a separate resistance standard solely for the purpose of calibrating the loss SSRTMDAC. The technique of the present invention has, instead, as also is described in U.S. Pat. No. 4,772,844, a single, ultra-stable, temperature controlled capacitor as the ultimate reference for both capacitance and loss.

6. DSP Driving and Feedback Control

Figure 5:
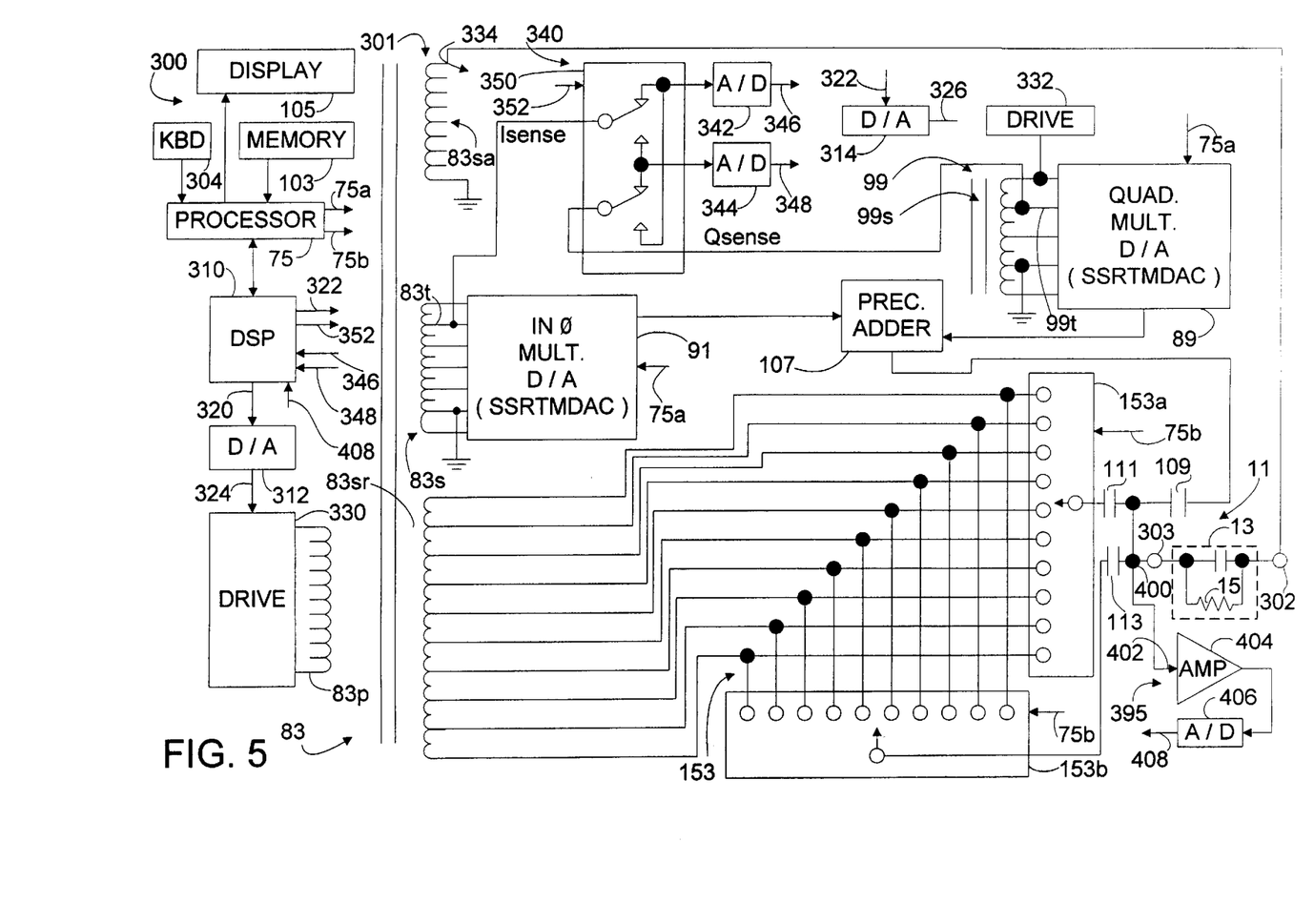
FIG. 5 is a schematic electric circuit diagram/block diagram showing a ratio transformer capacitance bridge measuring circuit including driving and control circuitry with feedback to maintain and to correct in real time amplitude and phase relations of signals produced by the ratio transformers according to an embodiment of the invention.

Referring to FIG. 5, a ratio transformer capacitance bridge measuring circuit 300, which includes a driving and feedback control circuit 301 in accordance with the present invention, is shown schematically. The driving and feedback control circuit 301 is used to supply driving signals to the main ratio transformer 83 and a quadrature ratio transformer 99. The secondary 83s of the ratio transformer 83 is coupled to in-phase multiplying digital-to-analog converter 91 for third through seventh decades. The winding 99s of the ratio transformer 99 is coupled to quadrature multiplying digital-to-analog converter 89 for third through seventh decades for use as was described above and in U.S. Pat. No. 4,772,844. The unknown impedance 11, such as unknown capacitance 13 and resistance 15 (sometimes referred to as dissipation factor, resistance, conductance, etc.), is coupled across terminals 302, 303. As was described above with respect to other drawing figures hereof and in U.S. Pat. No. 4,772,844, the ratio transformer capacitance bridge measuring circuit 300 is operable to measure the impedance of the unknown 11, for example, the capacitance value of the unknown capacitor 13 and the loss represented here by the resistor 15.

Portions of the circuit 300 that are the same or similar in element and function as is described above with respect to other drawing figures hereof are identified by the same reference numerals. Thus, the capacitors 109, 111 and 113, the precision adder 107, and the various banks of relay switches 153 and contacts 153a, 153b are, for example, similar to those described above. If desired, the capacitors 109, 111 and 113 may be maintained in a temperature controlled oven to avoid changes in capacitance due to temperature variations.

Inputs to the circuit 300 may be provided by a user via a keyboard 304 or by some other input device or connection, e.g., a connection to a computer. The measurements made by the circuit 300 may be displayed by the readout or display 105.

The present invention uses a digital signal processor (DSP) 310 for driving functions and for feedback control functions for the circuit 301. An exemplary DSP is that sold by Analog Devices under Model No. 2181; however, other DSP devices may be used. Other processors also may be used, for example, a microprocessor or another device, such as one sold by Intel Corporation under the trademark Pentium or by Advanced Micro Devices under the trademark K-6. Sometimes a DSP may be a microprocessor that is optimized to carry out desired functions, such as mathematics functions. The processor used as DSP should have adequate speed to carry out the functions required to obtain the operation as desired, such as the operation described herein.

The DSP is used in the present invention to develop mathematically a digital representation of a varying wave signal, such as a sinusoidal wave signal. The digital representation is delivered from the DSP 310 to respective digital-to-analog converter circuits 312, 314 to develop respective analog sinusoidal signals. The analog sinusoidal signals may be relatively accurately defined sine wave signals. Preferably the two sine wave signals produced respectively by the D/A's 312, 314 have a fixed phase relation, for example, 90° out of phase or some other phase relation, as may be desired. Also, the amplitudes of the sinusoidal signals produced by the D/A's 312, 314 preferably have a prescribed amplitude relationship, for example, in an ideal situation, the two being equal amplitude or, more preferably, the two resulting in signals produced by respective secondary 83s and winding 99s of the ratio transformers 83, 99 being equal. However, it will be appreciated that the DSP in cooperation with the respective D/A's 312, 314 and any other circuitry associated therewith, such as amplifiers, attenuators, etc., may result in the secondary 83s and winding 99s producing output signals that are of different amplitudes.

It will be appreciated that the DSP 310 can be programmed to produce the respective digital representations of sinusoidal signals in conventional fashion. Those respective digital representations of sinusoidal signals are produced on output lines 320, 322 which are coupled to respective inputs to the digital-to-analog converter 312, 314. The outputs 324, 326 from the D/A's 312, 314 are coupled to driver circuits 330, 332 which respectively provide inputs to drive the ratio transformers 83, 99. The signals on outputs 324, 326 are, for example, sinusoidal signals of amplitude, frequency and phase determined by the digital representations thereof as produced by the DSP 310. The actual frequency of the sinusoidal signals on lines 324, 326 can be changed to a different frequency simply by an input or a change in programming of the DSP 310, as is well known. Such changes can be used to change the frequency at which the impedance 11 is driven during the measurement thereof. An exemplary sampling frequency at which data is obtained by the DSP 310 and at which the D/A's 312, 314 are operated to develop sinusoidal signals may be, for example, on the order of 50 kHz.

The sinusoidal signal on the line 324 is delivered to a main transformer driver amplifier system 330, which in turn drives the main ratio transformer 83 providing an input to the primary 83p thereof to produce on the secondary 83s signals of respective amplitudes, depending on the tap of the secondary, as in usual transformer operation. The accuracy of signal conversion in ratio transformers is well known and is useful in the present invention to maintain the accuracy of the circuit 301 and the measurements made thereby. The sinusoidal signal on the line 326 is coupled to a driver amplifier 332, which provides a direct input to the quadrature ratio transformer 99. The quadrature transformer 99 winding 99s is directly driven by the driver 332. The quadrature ratio transformer may be, for example, an autotransformer or other transformer useful to provide the functions of the invention described herein.

The D/A's 312, 314 may be relatively inexpensive electronic devices, such as those known variously as "codec" or as sigma-delta converters and which sometimes are used for converting audio signals to digital signals or digital signals to audio signals. Such electronic devices have been found to have relatively good linearity. However, such electronic devices also have been found to be relatively imprecise and/or unstable and/or lacking in precise uniformity from device to device.

However, it is desirable that a precise amplitude relationship and phase relationship exist between signals at corresponding respective taps of the secondary 83s and winding 99s, such as, for example, taps 83t, 99t. If the ratio transformers are substantially the same and the arrangement of taps of the secondary 83s and winding 99s are substantially the same, and the amplitude phase relationship of the signals occurring on the taps 83t and 99t are maintained, then due to the precision of the ratio transformers, the relationship of signal amplitude and phase at other corresponding pairs of taps of the respective ratio transformer secondary 83s and winding 99s also can be expected to be maintained. The maintaining of such amplitude and phase relationship is desirable to maintain accuracy in the measurements made by the ratio transformer capacitance measuring bridge of the invention.

In addition to the secondary 83s, the main or in-phase ratio transformer includes a relay secondary 83sr and an attenuator secondary 83sa. The relay secondary 83sr has respective taps coupled to respective contacts of first and second relay banks 153a, 153b of the bank relay switch 153, which is used as described above. The attenuator secondary 83sa is coupled to the unknown impedance 11 at terminal 302. If desired, additional circuitry may be coupled to the attenuator secondary 83sa to extend the range of the ratio transformer capacitance bridge 300.

Briefly summarizing here, the arms of the bridge 334 of the ratio transformer capacitance bridge circuit 300 includes, respectively:

a. The secondary 83s, in-phase SSRTMDAC 91, winding 99s, quadrature SSRTMDAC 89, precision adder 107, relay secondary 83sr, and relay banks 153a, 153b of the bank relay switch 153;

b. The capacitors 109, 111, 113;

c. The attenuator secondary 83sa; and d. The unknown 11.

Also, briefly summarizing operation of the bridge 334 of the circuit 300, the DSP 310 provides digital representations of two sinusoidal signals. The D/A's 312, 314 convert such digital representations to sinusoidal signals, which are provided the bridge 334 via the ratio transformers 83, 99. In the embodiment illustrated and described the two sinusoidal signals have a desired amplitude and phase relation, e.g., such that the amplitudes of the signals at taps 83t and 99t are equal and the sinusoidal signals at those taps are out of phase by 90°. The feedback circuit 340 of the driving and feedback control circuit 301 monitors the signals in the bridge 334, e.g, the signals at the taps 83t, 99t and provides real time feedback to the DSP 310 to make real time corrections to the digital signal representation of the sinusoidal signals to try to maintain the desired amplitude and phase relationships, as is described. The frequency of the sinusoidal signals in the bridge can be selected, and, if desired, changed, according to conventional programming of the DSP 310.

The outputs on the respective secondary 83s and winding 99s of the ratio transformers 83, 99 are monitored by a feedback circuit 340. The feedback circuit 340 includes a pair of A/D's 342, 344, such as the codec devices mentioned above. The A/D's 342, 344 monitor the signals on the taps 83t, 99t and produce digital signal representations thereof on lines 346, 348, which are coupled as feedback inputs to the DSP 310. The feedback signals are monitored by the DSP which is operative to make corrections in at least one (or both) of the respective digital representations of sinusoidal wave signals produced on outputs 320, 322 from the DSP. By making the appropriate correction(s), the desired phase relationship and the desired amplitude relationship between the signals on the tap 83t and on the tap 99t can be maintained.

The codec A/D's 342, 344 are relatively inexpensive devices, and they are not precise devices. For example, the gain of such an A/D can vary up to about 10%. However, the present invention uses the A/D's uniquely to obtain high precision and resolution, as is described below. The imprecision in the A/D's 342, 344, whether codecs or other A/D's, is overcome in the present invention by alternating the tap 83t, 99t monitored by the respective A/D's 342, 344. A double pole, double throw switch 350, for example, an analog switch or some other suitable switch, is operable under control of the DSP 310 providing a signal on line 352 to throw the switch to one or the other conditions thereof. The analog switch 350 alternately is operable to couple one of the A/D's 342, 344 to monitor the tap 83t and the other to monitor the tap 99t and in response to the signal on line 352, for example, to reverse such connections and monitoring.

The A/D's 342, 344 are operated by the DSP 310 to provide digital representations of the signals on the taps 83t, 99t in the usual fashion. Additionally, a windowing function or window filter function may be provided with respect to the feedback signals on lines 346, 348 from the A/D's 342, 344 to avoid phase jitter effects resulting from sampling uncertainty, e.g., as might occur when the switch 350 is thrown. Such windowing or filtering is described further below.

The detector circuit 395 of the circuit 300 in FIG. 5 provides a function similar to the detector circuit 95 of FIG. 4. The detector circuit 395 is operable to provide a digital representation of the extent of imbalance or unbalance of the ratio transformer capacitance measuring bridge of the invention. The standard capacitances 109, 111, 113 are coupled to a junction or node 400 of the bridge 334, and the unknown impedance 11 also is coupled to the node 400. The signal at the node 400 represents the imbalance of the bridge 334. The node 400 is coupled to the input 402 of the detector 395.

The detector circuit 395 includes an amplifier 404 and an A/D 406. A signal at the input 402 from the node 400 to the amplifier 404 is the imbalance signal representing the extent that the bridge circuit 334 of the circuit 300 is out of balance. The amplifier 404 amplifies that signal, and the A/D 406 digitizes that signal and provides the digital representation thereof on detector output line 408, which is coupled to the DSP 310. The processor 75 using results from the DSP 310 operates the various portions of the circuit 300 to minimize the signal at the node 400 thereby to try to balance the ratio transformer capacitance measuring bridge circuit 300 and to obtain a value for the impedance 11. Accordingly, the DSP 310 and the processor 75 may operate various relays (such as those shown at 153), the various A/D and D/A converters described above, the double pole, double throw switch 350, etc. to try to balance the bridge circuit 334.

Summarizing operation of an embodiment of the invention, the DSP 310 generates the sinusoidal drive for the ratio transformers 83, 99; the drive for the transformer 83 is referred to herein as the $I_{drive}$, and the drive for the transformer 99 is referred to as the $Q_{drive}$. Relative to the drive, namely $I_{drive}$, provided the transformer 83, the relation of the drive, namely, $Q_{drive}$, for the ratio transformer 99 (sometimes referred to as the quadrature transformer or the transformer that is out of phase relative to the phase of the transformer 83) is adjusted, for example, to 90° or other desired phase relation by the DSP by sensing the voltages at the taps 83t, 99t. The DSP 310 then adjusts the generated $Q_{drive}$ amplitude and phase for a minimal error term in the relative phase and amplitude relationship according to the mathematical calculations described below. Thus, the DSP 310 generates the proper drive signals and continuously corrects the $Q_{drive}$ signal to maintain a precise phase relation of the signals occurring at the taps 83t, 99t.

Meanwhile, the processor 75 uses the results of the output data at line 408 as processed by the DSP 310 to operate the relays 153 and the SSRTMDAC's 89, 91 to balance the bridge 334. Thus, the DSP 310 typically operates the various D/A and A/D devices and the switch 350 in the circuit 300 and also performs the various computations described further below; and the processor 75 typically operates the relays 153 and the SSMRTMDAC's 89, 91. The processor 75 does the balancing of the bridge 334 and the DSP 310 keeps the sinusoidal drive signals at the proper amplitudes and phase relation, although various functions may be shared or otherwise divided by any processor(s) and any DSP(s) used in the invention.

Continuing to consider operation of the ratio transformer capacitance bridge circuit 300, a user selects a frequency at which the impedance 11 is to be measured or tested and the ratio transformer capacitance bridge circuit is to be operated, and that selected frequency is input to the DSP 310 and/or the programming therefor to carry out the measurements at such frequency. An exemplary frequency is 1,000 Hz. However, the invention may operate, for example, from on the order of 50 Hz to 20 kHz. If desired, the DSP 310 may be programmed or selected to operate at only a single frequency; at a selected one of plural discrete frequencies; at one of a plurality of frequencies selected according to a prescribed function or selected from a continuous range of frequencies; etc. Depending on the particular frequency at which the impedance 11 is to be tested, the DSP 310 in standard manner may use an appropriate look-up table to determine the digital values to be placed on output lines 320, 322 at respective times to operate the respective D/A's 312, 314 to provide analog signals (e.g., sine wave signals) on lines 324, 326 to drive the respective ratio transformers 83, 99. Other techniques may be used with the DSP 310 to obtain such digital representations; for example, the DSP could be programmed in conventional manner to calculate such digital representations or the values thereof.

As will be described in further detail below, depending on the feedback information received on lines 346, 348 from the A/D's 342, 344, the DSP 310 may adjust or correct a respective one (or both) of the signals on lines 320, 322 to try to maintain a desired phase and amplitude relation between the signals on the taps 83t and 99t. The double pole, double throw switch 350 is operated periodically by the DSP by signals on line 352 to provide a commutating function to alternate the respective tap 83t, 99t being monitored or detected by a respective A/D 342, 344. The commutating function provided by the switch 350 contributes to precision of the ratio transformer capacitance measuring bridge circuit 300 of the invention. Also, in the DSP 310 the windowing function or window filtering function mentioned elsewhere herein may be applied to avoid phase jitter effects resulting from sampling uncertainty, e.g., as might occur when the switch 350 is thrown. Such windowing or filtering is described further below.

The digital representation of the imbalance signal on line 408 at the output of the detector 395 is provided the DSP 310 and in turn the processor 75 which operates other portions of the ratio transformer capacitance bridge 300 to try to balance the bridge to obtain a value measurement for the impedance 11. For example, the setting of the relay bank switches 153, the SSRTMDAC's 89, 91, and the value at the output 408 of the detector 395 when bridge imbalance is minimized represents such impedance; and under control of the processor 75, for example, that impedance can be displayed on the display or readout 105 and/or otherwise used.

The ratio transformer capacitance bridge measuring circuit 300 and the driving and feedback control circuit 301 thereof may be used in conjunction with various ones of the embodiments illustrated and described in U.S. Pat. No. 4,772,844.

7. Correcting and Maintaining Amplitude and Phase Relations

In FIG. 5 two signals labeled $I_{SENSE}$ and $Q_{SENSE}$ (sometimes collectively referred to below as I/Q sense) are, respectively, at the taps $83t$, $99t$ of the secondary $83s$ and winding $99s$ of the ratio transformers 83, 99. It is these signals that must be accurately related to each other. These signals are fed through the commutation switch 350 to a pair of A/D converters 342, 344 so that the signals can be read by the DSP 310. As described in more detail below, the presence of the commutation switch 350 allows differences between these A/D's 342, 344 to be removed. This creates two measurement channels with extremely low relative gain and phase error. The DSP 310 samples these two channels (the outputs of A/D's 342, 344) according to the sampling frequency, e.g, every 20 microseconds (50,000 times per second). It uses this data in real time to compute new adjustment factors approximately every one tenth second, for example, to the $I_{drive}$ and $Q_{drive}$ signals on lines 320, 322 that drive the two ratio transformers 83, 99.

The detailed computations that the DSP 310 performs to implement this method are described below.

Two fundamental, real-time reference signals are generated within the DSP:

$$I_{ref}=\sin \omega t \text{ and } Q_{ref}=\cos \omega t \qquad (8)$$

The angular frequency is $\omega$ and the time is t. The variable t is updated and $I_{ref}$ and $Q_{ref}$ are re-computed, for example, every 20 microseconds (the sampling period, for example).

The signals $I_{drive}$ and $Q_{drive}$ that drive the in-phase ratio transformer 83 (sometimes referred to below as the I ratio transformer) and the quadrature ratio transformer 99 (sometimes referred to below as the Q ratio transformer) are, as follows:

$$I_{drive}=I_{ampl}I_{ref} \qquad (9)$$

$$Q_{drive}=-Q_{ampl}\cos(\omega+Q_{phase}) \qquad (10)$$

where $I_{ampl}$ is a constant ("ampl" represents an abbreviation of "amplitude") and $Q_{ampl}$ and $Q_{phase}$ are updated periodically using the following relationships:

$$Q_{ampl}=Q_{ampl}+q_{amplerr} \qquad (11)$$

$$Q_{phase}=Q_{phase}+q_{phaseerr} \qquad (12)$$

The variables $q_{amplerr}$ and $q_{phaseerr}$ are computed sums according to respective pairs of equations below made over 4n sine wave cycles. The value or number "n" is an integer, and the sine wave is that driving the bridge 334.

As will be appreciated, in the example presented here the $I_{sense}$ signal and the $I_{drive}$ signal which drives the in-phase ratio transformer 83 are used as reference, and the $Q_{drive}$ signal which drives the quadrature ratio transformer 99 periodically is corrected to obtain and/or to maintain a desired amplitude and phase relation between the $I_{sense}$ signal and the $Q_{sense}$ signal.

The computations may be made for any phase relation $\theta$ using the two general equations, as follows:

$$q_{amplerr}=k_1\{\Sigma[iI_{ref}-q(I_{ref}\cos\theta-Q_{ref}\sin\theta)]\Sigma iI_{ref}+\Sigma[iQ_{ref}-q(I_{ref}\sin\theta+Q_{ref}\cos\theta)]\Sigma iQ_{ref}\} \qquad (13)$$

$$q_{phaseerr}=k_1\{\Sigma[iI_{ref}-q(I_{ref}\cos\theta-Q_{ref}\sin\theta)]\Sigma iQ_{ref}+\Sigma[iQ_{ref}-q(I_{ref}\sin\theta+Q_{ref}\cos\theta)]\Sigma iI_{ref}\} \qquad (14)$$

where i and q are the samples (values) from the I/Q sense and Q/I sense lines as read by the two A/D's 342, 344 every 20 microseconds, for example. An I/Q sense set-up by the switch 350 couples the $I_{sense}$ line to one of the A/D's 342, 344 and the $Q_{sense}$ line to the other of those A/D's 342, 344. A Q/I sense set-up has the opposite or commutated connections. $I_{ref}$ and $Q_{ref}$ are recalculated every 20 microseconds. $k_1$ is a constant whose exact value is not important. If $k_1$ is small, the correction process will occur more slowly. If $k_1$ is too large, the corrections will swing from one extreme to the other and never converge.

The above pair of equations can be simplified when the values of the phase shift $\theta$ between the $I_{sense}$ and $Q_{sense}$ signals are 0°, 90° or 180°. The simplified error equations for these phase relations are, as follows:

For Q lagging I by 0 degrees:

$$q_{amplerr}=k_1[\Sigma(iI_{ref}-qI_{ref})\Sigma iI_{ref}+\Sigma(iQ_{ref}-qQ_{ref})\Sigma iQ_{ref}] \qquad (15)$$

$$q_{phaseerr}=k_1[\Sigma(iI_{ref}-qI_{ref})\Sigma iQ_{ref}+\Sigma(iQ_{ref}-qQ_{ref})\Sigma iI_{ref}] \qquad (16)$$

For Q lagging I by 90 degrees:

$$q_{amplerr}=k_1[\Sigma(iI_{ref}+qQ_{ref})\Sigma iI_{ref}+\Sigma(iQ_{ref}-qI_{ref})\Sigma iQ_{ref}] \qquad (17)$$

$$q_{phaseerr}=k_1[\Sigma(iI_{ref}+qQ_{ref})\Sigma iQ_{ref}+\Sigma(iQ_{ref}-qI_{ref})\Sigma iI_{ref}] \qquad (18)$$

For Q lagging I by 180 degrees:

$$q_{amplerr}=k_1[\Sigma(iI_{ref}+qI_{ref})\Sigma iI_{ref}+\Sigma(iQ_{ref}+qQ_{ref})\Sigma iQ_{ref}] \qquad (19)$$

$$q_{phaseerr}=k_1[\Sigma(iI_{ref}+qI_{ref})\Sigma iQ_{ref}+\Sigma(iQ_{ref}+qQ_{ref})\Sigma iI_{ref}] \qquad (20)$$

The I/Q sense inputs are physically commutated by the switch 350 every 2n cycles. These commutations are undone numerically within the DSP 310. This causes half of the above error sums to be generated with one I/Q sense arrangement and half with the other arrangement, i.e., the Q/I sense set-up. The result is the elimination of the effects of asymmetries between these two $I_{sense}$ and $Q_{sense}$ inputs and between the A/D's 342, 344. In essence, two very identical measurement channels are created, limited only by the symmetry of the commutation switching circuit.

Using the above-described method, the relationships between amplitudes and between phases of the respective $I_{sense}$ and $Q_{sense}$ signals can be obtained in real time as the signals are generated with relatively high degree of precision; and the $Q_{drive}$ signal can be corrected in real time with respect to the $I_{drive}$ signal to try to maintain such relationships.

Figure 6:
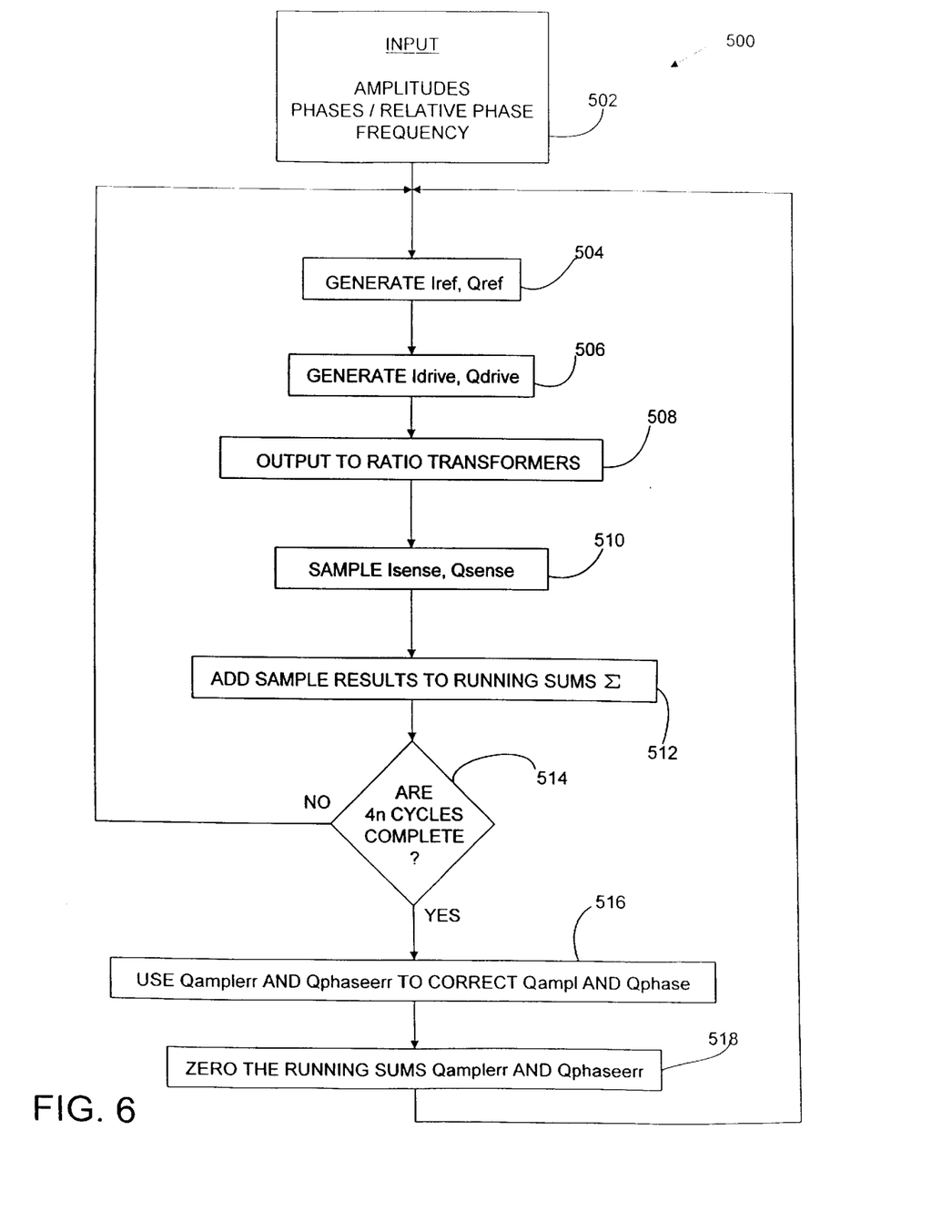
FIG. 6 is a functional block diagram showing steps to generate ratio transformer drive signals.

Briefly referring to FIG. 6, a high level functional block diagram or computer program flow chart 500 shows part of the process of generating $I_{drive}$ and $Q_{drive}$ signals to drive the ratio transformers 83, 99. At step 502 the desired amplitudes and phases/relative phase of the $I_{sense}$ and $Q_{sense}$ signals is input; also, the frequency $\omega$ at which the circuit 300 is to be operated to operate or to drive the unknown impedance 11 may be input. For example, such inputs can be built into the DSP 310 and/or to the processor 75 (FIG. 5) or may be entered by keyboard 304 or some other means. At step 504 the DSP 310 generates the $I_{ref}$ and $Q_{ref}$ signals. At step 506 the $I_{drive}$ and $Q_{drive}$ signals for driving the ratio transformers are generated according to the computations and relations of respective equations above, and the $I_{drive}$ and $Q_{drive}$ signals are output, e.g., via respective D/A's, to the respective ratio transformers 83, 99 at step 508. At step 510 the $I_{sense}$ and $Q_{sense}$ signals are sampled. Then, at step 512 the values of the $I_{sense}$ and $Q_{sense}$ signals are added to the running sums according to the respective equations above. The windowing function multiplier mentioned above may be applied before such $I_{sense}$ and $Q_{sense}$ signals are added to respective running sums. At decision block 514 an inquiry is made whether 4n cycles of the sine wave (described above) have been completed. If not, the flow diagram loops to the input of step 504. If so, then at step 516 the $q_{amplerr}$ and $q_{phaseerr}$ values are used as above to correct $Q_{ampl}$ and $Q_{phase}$. At step 518 the running sums of $q_{amplerr}$ and $q_{phaseerr}$ are zeroed, and then a loop is completed to provide the corrected $Q_{ampl}$ and $Q_{phase}$ values back to step 504.

In an exemplary embodiment of the invention, when the result of the decision block 514 is "No", the complete branch followed takes 20 microseconds. The "Yes" branch followed from the decision block 514 occurs much less frequently that the aforementioned branch, for example, it is no faster than 4n times the period of the sine wave.

It will be appreciated that corrections, if any are required, are made according to the computations and relations of respective equations above; also, as was described above, during the correcting procedure the feedback circuit 340 for each of the $I_{sense}$ and $Q_{sense}$ signals using both A/D's 342, 344, which are commutated by the switch 350, provides precision although the A/D's 342, 344 themselves may be somewhat imprecise, especially relative to each other.

8. Windowing while Correcting Amplitude and Phase Relations

As the circuit 300 undergoes commutation, such as that described above relative to the switch 350 or using some other means, the frequency at which samples are taken is not in general a precise multiple of the frequency at which commutating occurs; therefore, end effects are possible at the point when a commutation occurs, thus resulting in sampling uncertainty that may cause phase jitter. The windowing technique described here, or some other suitable windowing technique, may be used to avoid such phase jitter. In particular, the windowing distributes the weighting of the sampling for the feedback signals so that the sampling at the beginning and the end of a given window have relatively little effect on the average computed as part of the feedback and correction process described above compared to the greater weighting and, therefore, effect of the samples considered more remotely from the boundaries of the window.

More particularly, as the above sums are calculated, each $I_{sense}$ and $Q_{sense}$ sinusoidal signal term is multiplied by a triangular function of time. The function starts at zero and ramps linearly up to 1 at which time the sum is one quarter computed (n cycles of the sinusoidal signal). It then ramps linearly back to zero at which time the sum is half complete (2n cycles). The I/Q sense inputs are then commutated, e.g., by the switch 350, and the process is repeated for a total of 4n cycles. This windowing process greatly reduces phase jitter in the error results.

Using such triangular function or windowing, immediately upon the occurrence of a commutating, e.g., the throwing of the switch 350 to one of its two states, the triangular function value is zero or is near zero; therefore, multiplying that value times a computed summation of one of the pairs of equations above, the value of that summation is zero or close to zero. Since there may be sampling uncertainty in the circuit 300 at that time immediately following the occurrence of such a commutating, little impact on correction of the $Q_{drive}$ signal will occur. As time passes following such commutating, the magnitude of the triangular function or windowing increases, and the impact of the summations used to obtain correction of the $Q_{drive}$ signal increases to try to obtain the desired correction and, thus, the desired relations between the $I_{sense}$ and $Q_{sense}$ signals.

It will be appreciated that although triangular function filtering or windowing is described here, the windowing may be some other function, including, for example, according to a sinusoidal function. Preferably the windowing is not according to a square wave function.

Thus, it will be appreciated that the invention may be used to measure impedance with a high precision.

We claim:

1. A capacitance bridge to measure an unknown impedance, comprising,
   ratio transformers having windings which are in a bridge circuit,
   a known capacitance in the bridge circuit,
   an arm of the bridge circuit connectible to the unknown capacitance,
   a detector coupled across the bridge circuit to detect the extent of balance or imbalance of the bridge, and
   correction circuitry for commutating signals occurring in the bridge circuit to enhance precision:
     wherein said correction circuitry comprises circuitry to provide real time feedback to correct signals driving the ratio transformers.

2. The invention of claim 1, further comprising a digital device for developing signals to drive the respective ratio transformers, said correction circuitry including respective A/D converters coupled to respective ratio transformers to provide digital representations of output signals from the ratio transformers for use to adjust at least one of the signals driving a respective ratio transformer to strive to achieve a desired phase and/or amplitude relation of such output signals, and a commutator for commutating connections of respective A/D converters to respective ratio transformers.

3. The invention of claim 2, said digital device comprising a digital signal processor.

4. The invention of claim 1, further comprising a DSP for developing signals to drive the ratio transformers, the DSP being operable to produce digital representations of sinusoidal signals, D/A converters for converting such digital representations to analog sinusoidal signals for driving respective ratio transformers, and said correction circuitry including A/D converters for converting signals from respective windings of respective ratio transformers to digital representations thereof, and said DSP being operative in response to such digital representations to strive to obtain a prescribed relation between the signals in such windings.

5. The invention of claim 1, further comprising means for selecting the frequency of signals at which the unknown capacitance is to be operated by the bridge circuit during measuring.

6. The invention of claim 5, said means for selecting the frequency comprising means for operating the bridge at one or more of a plurality of frequencies.

7. The invention of claim 1, further comprising a display for displaying measured information regarding the unknown capacitance.

8. The invention of claim 1, wherein the bridge circuit is operable to strive to balance an unknown impedance, said bridge circuit comprising:
   first balancing means for generating an in-phase balancing signal, including a first of said ratio transformers, an input terminal and an output terminal;
   second balancing means for generating a quadrature phase balancing signal, including a second of said ratio transformers, an input terminal and an output terminal;
   means for generating first and second energizing signals for energizing said first and said second ratio transformers;

the phase of said second energizing signal differing from the phase of said first energizing signal by essentially 90 degrees;

means for coupling said output terminals to one terminal of said known capacitance;

said detector comprising a first detector terminal coupled to a second terminal of said known capacitance and a second detector terminal coupled to a reference terminal;

first and second unknown terminals for selective connection to the unknown impedance;

means responsive to output signals of said detector for generating signals for controlling said first and second balancing means; and means for calculating the value of the unknown impedance.

9. The invention of claim 8, wherein at least one of said first and said second balancing means comprises an SSRT-MDAC means.

10. The invention of claim 9, wherein said SSRTMDAC means includes the ratio transformer of said at least one balancing means, said last mentioned ratio transformer comprising:

a plurality of terminals and a reference terminal;

a summing circuit comprising a plurality of input terminals and an output terminal, said summing circuit providing a fixed discrete gain in a substantially ordered range of gains between each summing circuit input terminal and said summing circuit output terminal.

11. The invention of claim 1, wherein said ratio transformers are driven to produce output signals, respectively, that are substantially 90° out of phase with each other.

12. The invention of claim 8, wherein said bridge circuit further comprises:

means for measuring parameters of operation of said balancing means;

means for storing indicia representative of said measured parameters; and wherein said means for calculating utilizes said stored indicia in calculating the value of the unknown capacitance.

13. The invention of claim 1, wherein the correction circuitry corrects the gain and phase of signals driving the ratio transformers.

14. The invention of claim 8, wherein said means for generating comprises a digital device for developing signals to drive the respective ratio transformers, and wherein said correction circuitry includes respective A/D converters coupled to respective ratio transformers to provide digital representations of output signals from the ratio transformers for use to adjust at least one of the signals driving a respective ratio transformer to strive to achieve a desired phase and/or amplitude relation of such output signals, and a commutator for commutating connections of respective A/D converters to respective ratio transformers.

15. A ratio transformer capacitance bridge to measure unknown impedance, comprising a DSP for supplying signals at one or more frequencies to drive the bridge, a detector for detecting the extent of balance or imbalance of the bridge, and an error corrector providing real time feedback to the DSP to enhance precision of the supplied signals that drive the bridge.

16. The invention of claim 15, further comprising means for selecting the frequency at which the bridge is driven.

17. The invention of claim 15, further comprising ratio transformers connected in the bridge, and D/A converters for converting signals from the DSP to signals for driving respective ratio transformers to drive the bridge.

18. The invention of claim 17, further comprising means for striving to balance the bridge, wherein the respective ratio transformers are driven by signals $I_{drive}$ and $Q_{drive}$, wherein $I_{drive}=I_{ampl}I_{ref}$ and $Q_{drive}=-Q_{ampl}\cos(\omega t+Q_{phase})$, where $I_{ampl}$ is a constant and $Q_{ampl}$ and $Q_{phase}$ are updated periodically;

wherein said error correcting means comprises program means for using said feedback to supply error correction to values $Q_{ampl}$ and $Q_{phase}$ according to the following relationships:

$$Q_{ampl}+q_{amplerr},$$

$$Q_{phase}=Q_{phase}+q_{phaseerr},$$

wherein the variables $q_{amplerr}$ and $q_{phaseerr}$ are computed sums made over 4n sine wave cycles of the signals driving the ratio transformers and such computations are made according to the following relationships:

$$q_{amplerr}=k_1\{\Sigma[iI_{ref}-q(I_{ref}\cos\theta-Q_{ref}\sin\theta)]\Sigma iI_{ref}+\Sigma[iQ_{ref}-q(I_{ref}\sin\theta+Q_{ref}\cos\theta)]\Sigma iQ_{ref}\},\text{ and}$$

$$q_{phaseerr}=k_1\{\Sigma[iI_{ref}-q(I_{ref}\cos\theta-Q_{ref}\sin\theta)]\Sigma iQ_{ref}+\Sigma[iQ_{ref}-q(I_{ref}\sin\theta+Q_{ref}\cos\theta)]\Sigma iI_{ref}\},$$

where i and q represent the feedback to the DSP, θ is the phase angle relation between the two signals driving respective ratio transformers, and $k_1$ is a constant whose value is selected such that if $k_1$ is small, the correction process will occur more slowly, and if $k_1$ is too large, the corrections will swing from one extreme to the other and never converge.

19. The invention of claim 15, wherein said error correcting means comprises program means to alter the feedback according to a non-rectangular windowing function to avoid phase jitter effects resulting from sudden transitions that occur upon each commutation.

20. A method of driving ratio transformers, which generate voltage ratios, in a ratio transformer capacitance bridge, comprising supplying a digital signal to a digital-to-analog converter, converting the digital signal to an analog signal, delivering the analog signal to the ratio transformer monitoring the signals from the ratio transformer using an analog-to-digital converter, and using a digital representation of the ratio transformer output to correct the supplied digital signal.

21. The invention of claim 20, said supplying comprising using a DSP to generate digital signals representing frequency and amplitude of the signals supplied the ratio transformers, and said using a digital representation comprising using such digital representation as a feedback to the DSP.

22. The invention of claim 21, said using such digital representation as a feedback to the DSP comprises providing real time feedback to the DSP.

23. A driving circuit for a ratio transformer capacitance bridge, comprising a DSP for generating digital signals representing frequency and amplitude of a driving signal for a ratio transformer, a digital-to-analog converter for converting the digital signals to an analog signal of a frequency and amplitude representative of the digital signal, a monitor for the DSP comprising an analog-to-digital converter, and connection of the digital representation of the ratio transformer output back to the DSP.

24. A method of developing precision analog signals using a DSP, comprising using the DSP to develop a digital signal, converting the digital signals to two analog signals using respective digital-to-analog converters, periodically sampling the two analog signals and supplying to the DSP the results of such sampling for error correction, said periodic sampling comprising sampling each of said analog signals by respective analog-to-digital converters and alternating the analog-to-digital converters to which respective analog signals are delivered.

25. The method of claim 24, said supplying to the DSP the results of such sampling for error correction comprising providing real time error correction.

26. A ratio transformer capacitance bridge for measuring the value of a capacitance, comprising a bridge circuit, one or more ratio transformers coupled in the bridge circuit, a detector coupled across the bridge to detect the extent of balance or imbalance, a reference capacitance, a DSP and digital-to-analog converter circuitry to drive the respective ratio transformers with respective signals having a prescribed relation, a monitor circuit monitoring the outputs of the ratio transformers, and providing feedback to the DSP to maintain the prescribed phase and/or amplitude relation.

27. The ratio transformer capacitance bridge of claim 25, said providing feedback to the DSP comprising providing real time feedback to the DSP.

* * * * *